United States Patent
Correia

(10) Patent No.: US 10,608,389 B2
(45) Date of Patent: Mar. 31, 2020

(54) FEMALE CONNECTOR COMPRISING AN OPENING FOR ENGAGEMENT WITH A MALE CONNECTOR EQUIPPED WITH A GATE FOR CLOSING SAID OPENING

(71) Applicant: SCHNEIDER ELECTRIC INDUSTRIES SAS, Rueil Malmaison (FR)

(72) Inventor: Arthur Correia, Brie Comte Robert (FR)

(73) Assignee: SCHNEIDER ELECTRIC INDUSTRIES SAS, Rueil Malmaison (FR)

( * ) Notice: Subject to any disclaimer, the term of this patent is extended or adjusted under 35 U.S.C. 154(b) by 0 days.

(21) Appl. No.: 16/159,793

(22) Filed: Oct. 15, 2018

(65) Prior Publication Data

US 2019/0115701 A1    Apr. 18, 2019

(30) Foreign Application Priority Data

Oct. 18, 2017 (FR) ...................................... 17 59794

(51) Int. Cl.
*H01R 24/64* (2011.01)
*H01R 13/453* (2006.01)
(Continued)

(52) U.S. Cl.
CPC ......... *H01R 24/64* (2013.01); *H01R 13/4536* (2013.01); *H01R 13/4538* (2013.01); *H01R 13/502* (2013.01); *H05K 5/0217* (2013.01)

(58) Field of Classification Search
CPC ................ H01R 24/64; H01R 13/4536; H01R 13/4538; H01R 13/502; H01R 13/447;
(Continued)

(56) References Cited

U.S. PATENT DOCUMENTS 6,106,335 A * 8/2000 Merchant ............. H01R 13/506
439/620.23
6,595,696 B1 * 7/2003 Zellak .................. G02B 6/3825
385/72
(Continued)

FOREIGN PATENT DOCUMENTS

GB        2 434 926 A        8/2007
WO    WO 2017/066163 A1    4/2017
WO    WO 2017/100114 A1    6/2017

OTHER PUBLICATIONS

French Preliminary Search Report dated May 17, 2018 in French Application 17 59794, filed on Oct. 18, 2017 (with English Translation of Categories of Cited Documents).

*Primary Examiner* — Travis S Chambers
(74) *Attorney, Agent, or Firm* — Oblon, McClelland, Maier & Neustadt, L.L.P.

(57) ABSTRACT

A female connector including a body having a front wall including an opening for the insertion of a male connector, a back face opposite the front wall, a base wall extending from the back face to the front opening, a gate for closing the opening that is movable between an open position folded down against the base wall and a closed position closing off the opening, and a return spring tending to bring the gate back toward its closed position. The connector also includes a corridor extending along the base wall from the back face to the front opening, the corridor being sized to allow the gate by engaging the gate in the corridor through the back face up to the opening.

5 Claims, 4 Drawing Sheets

(51) Int. Cl.
*H01R 13/502* (2006.01)
*H05K 5/02* (2006.01)
(58) Field of Classification Search
CPC . H01R 13/4532; H01R 13/453; H05K 5/0217
USPC .................. 439/676, 136–139, 142, 578
See application file for complete search history.

(56) References Cited

U.S. PATENT DOCUMENTS

| | | | |
|---|---|---|---|
| 6,869,297 B2* | 3/2005 | Caveney | H01R 13/4536 439/138 |
| 7,364,444 B2* | 4/2008 | Kellock | H01R 13/4536 439/138 |
| 2009/0017656 A1 | 1/2009 | Lee | |
| 2012/0184118 A1* | 7/2012 | Lee | H01R 13/4536 439/137 |

* cited by examiner

FEMALE CONNECTOR COMPRISING AN OPENING FOR ENGAGEMENT WITH A MALE CONNECTOR EQUIPPED WITH A GATE FOR CLOSING SAID OPENING

TECHNICAL FIELD

The invention relates to the field of data transfer connectors or the like, such as connectors known under the name RJ45, or other similar types of connectors.

BACKGROUND OF THE INVENTION

In the data transfer field, the use of connectors of the RJ45 type is very widespread, these connectors being both inexpensive and remarkably reliable.

When connecting an electrical cabinet, the connectors present are not all connected, and in particular, unused female connectors may remain for an undetermined length of time. These unused connectors may subsequently have to be connected, for example in an extension phase of the installation.

Since the environment in such a cabinet may be harsh, over the long term, dust and grime may become inserted in the unused female connectors. Combined with significant ambient humidity, this situation may ultimately make the female connector unusable when the time comes for the extension of the installation.

In this context, specific covers are commercially available, which make it possible to plug each unused female connector, so as to guarantee that it does not deteriorate over time, due to dust and grime. However, adding such covers is tedious, such that the operator may forget to equip all or some of the unused female connectors.

In other solutions, the female connector is equipped with an external hatch or gate, with a return spring, which is intended to be folded down against the insertion opening when it remains free. This external gate may also be provided to slide and/or rotate so that it can remain attached to the rest of the connector while occupying an open position freeing the opening when a male element is inserted into said opening.

However, said external gate is a small part that creates a protuberance of the connector, which leads to a delicate assembly, and risks separating from the rest of the connector and becoming lost.

Alternatively, when the connector does not have its own closing element, its opening may be closed by a flap that is then secured to the support in which the connector is fastened, but which may lead to an integration and alignment difficulty of the connector for example relative to the opening of the flap of the support.

The aim of the invention is to provide a solution making it possible to resolve these drawbacks.

BRIEF DESCRIPTION OF THE INVENTION

The invention relates to a female connector comprising a body having a front wall comprising an opening for the insertion of a male connector, a back face opposite the front wall, a base wall extending from the back face to the front opening, a gate for closing the opening that is movable between an open position in which it is folded down against the base wall and a closed position in which it closes off the opening by covering it, a return spring tending to bring the gate back toward its closed position, and a corridor extending along the base wall from the back face to the front opening, said corridor being arranged to allow the gate to be mounted in the female connector by engaging said gate in the corridor via the back face up to the opening.

With this arrangement, the assembly of the closing gate is done simply and reliably while guaranteeing that it cannot separate from the body of the connector after assembly.

Such a connector thus built is protected from dust and may be fastened easily in any support, such as devices in residential or collective housing (plugs), patch panels in network connection bays, supports in cable raceways, etc.

The invention also relates to a connector thus defined, in which the return spring is held by the gate to be engaged with the gate in the corridor during assembly.

The invention also relates to a connector thus defined, in which the gate comprises two side lugs, and in which the body comprises, aligned with inner faces of the corridor, two guide grooves of said lugs during the engagement of the gate in the corridor.

The invention also relates to a connector thus defined, in which the return spring comprises two windings each engaged around a corresponding lug of the gate, each winding being extended by an arm bearing in a corresponding housing of the gate, the two windings being joined by an arch bearing on the base wall.

The invention also relates to a connector thus defined, comprising an intermediate wall extending parallel to the base wall near the rear face to delimit the corridor locally.

The invention also relates to a connector thus defined, in which the base wall comprises, near the opening, a rim on which a corresponding edge of the gate bears when it is in its closed position.

DETAILED DESCRIPTION OF THE INVENTION

Figure 1:
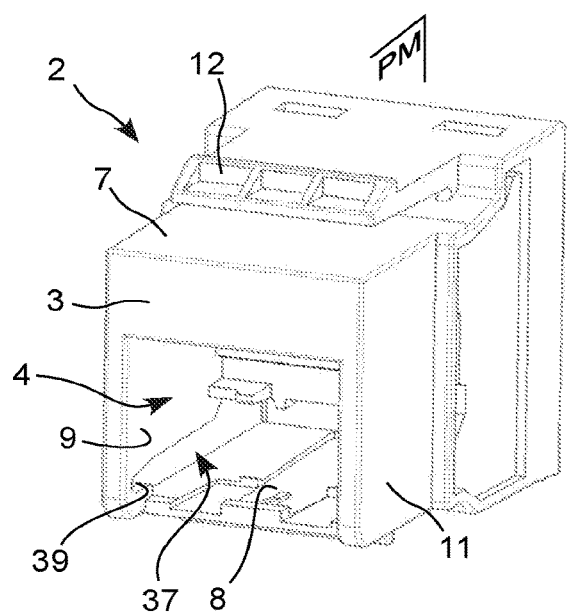
FIG. 1 is a perspective view of the connector body according to the invention with no gate.
Figure 2:
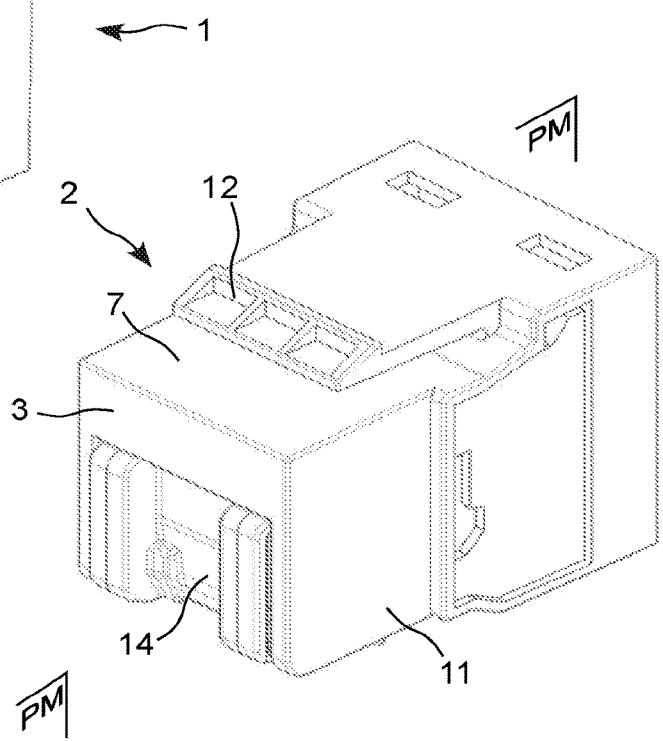
FIG. 2 is a perspective view of the connector body according to the invention equipped with its gate.
Figure 3:
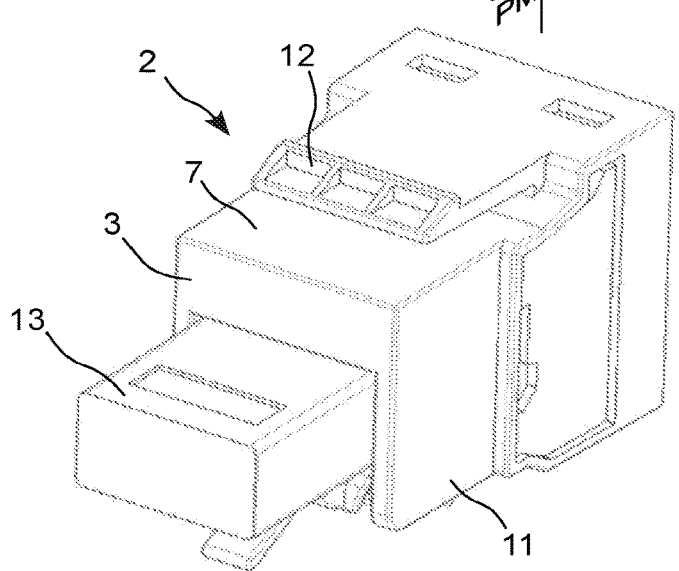
FIG. 3 is a perspective view of the connector body according to the invention in which a male connecting element is plugged.

The connector according to the invention that is shown in FIGS. 1 to 3, where it is identified by reference 1, comprises a generally parallelepiped body 2 including a front wall 3 having an opening 4 for receiving a connecting plug, and a back face 6. The back face 6, which is open, is intended to receive a base, not shown, to be fixed to the body 2 for connecting this body 2 to a cable, not shown in the figures.

The parallelepiped body 2, formed monobloc, is delimited between its front wall 3 and its back wall 6 by an upper wall 7, a lower base wall 8, a first side wall 9 and a second side wall 11. Said body 2 further comprises a fastening prong 12 outwardly running alongside its upper wall 7.

The opening 4 is intended to receive a male connecting element 13, shown in FIG. 2, to be fixed to the body 2 so as to connect a terminal or the like to the connector 1. To prevent dust and grime from entering the opening 4 when no element is connected to the connector 1, said connector 1 is equipped with a gate 14 closing off the opening 4 when no element 13 is present, as shown in the situation of FIG. 2.

Figure 5:
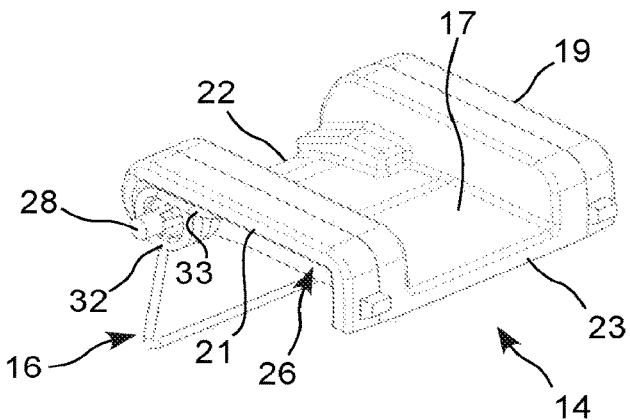
FIG. 5 is a first perspective view of the gate of the connector according to the invention with its return spring.
Figure 6:
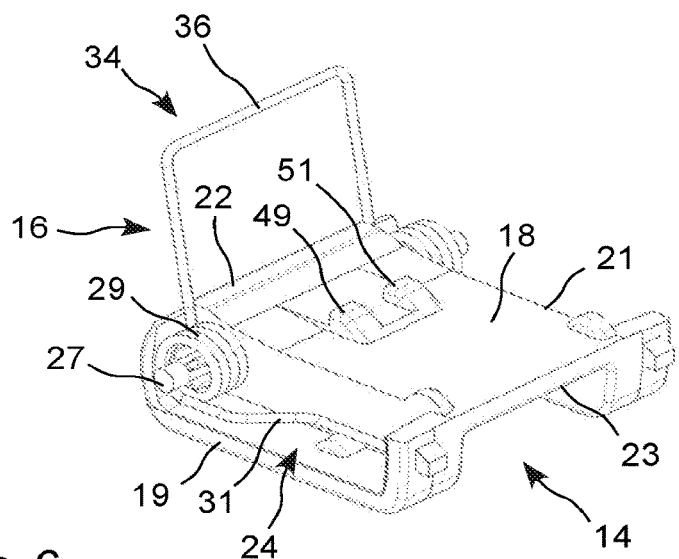
FIG. 6 is a second perspective view of the gate of the connector according to the invention with its return spring.

The gate 14 shown alone in FIGS. 5 and 6 is provided with a spring 16 to form an assembly separate from the body 2, which engages in said body 2 via the back face 6 along the lower base wall 8 to be assembled in said body 2.

The gate 14 is generally in the form of a wall with a substantially square contour, comprising a so-called outer face 17 and a so-called inner face 18, said wall extending laterally between a first edge 19 and a second edge 21, and longitudinally between a front edge 22 and a back edge 23.

As shown in FIGS. 5 and 6, the side edges 19 and 21 are offset relative to the central part of the gate, so as to form side housings, or side cavities identified by 24 and 26.

Additionally, the gate 14 comprises two lugs 27 and 28, which extend parallel to the front edge 22 and near said front edge. Said lugs 27, 28 protrude laterally respectively from the edge 19 and the edge 21 and the cavities 24 and 26 from which they emerge.

The spring 16 comprises a first winding 29 surrounding the first lug 27 while being extended by a first arm 31 extending in the first housing 24. It also comprises a second winding 32 surrounding the second lug 28 while being extended by a second arm 33 extending in the second housing 26. The two windings 29 and 32 are joined by an arched element 34 having a median portion 36 extending parallel to the front edge 22.

The spring 16 is movable relative to the gate 14 that it equips, between a deployed state like in FIGS. 5 and 6, where its arch 34 extends perpendicular to its inner face 18, and a folded state, not shown in FIGS. 5 and 6, in which the arch 34 is folded down against the inner face 18 while extending along the latter.

Figure 7:
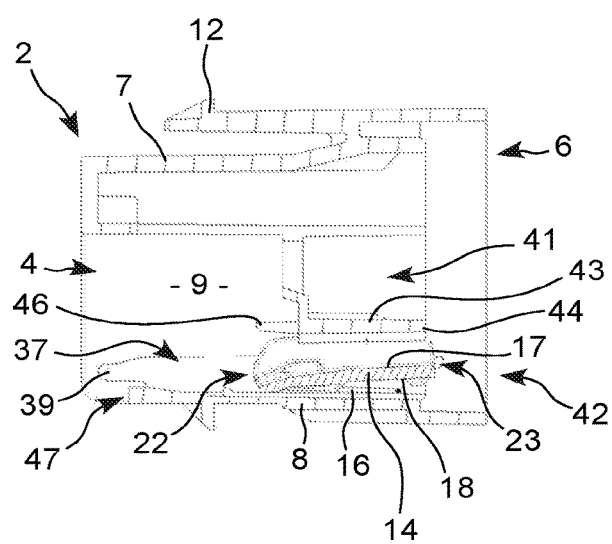
FIG. 7 is a lateral sectional view of the connector body according to the invention at the beginning of engagement of its gate.
Figure 8:
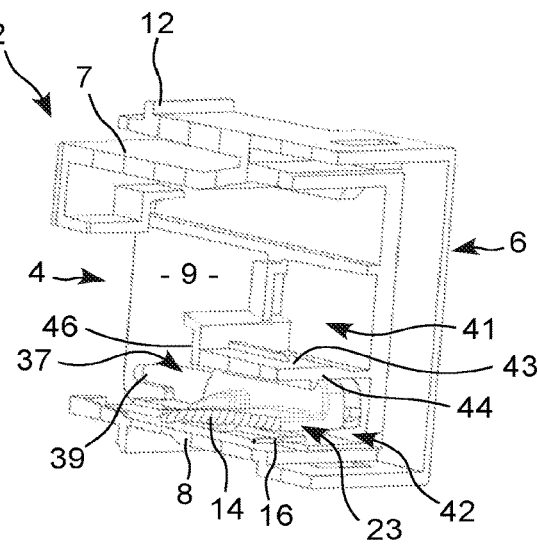
FIG. 8 is a perspective sectional view of the connector body according to the invention at the beginning of engagement of its gate.

The assembly of the gate 14 in the body 2 is done from the back of the gate toward the front. Concretely, and as illustrated in FIGS. 7 and 8, the gate 14 is first positioned facing the back face 6, while being oriented parallel to the lower wall 8. More concretely, at this stage, the front edge 22 of the gate 14 is located across from the back face 6, its outer face 17 oriented toward the upper wall 7 and its inner face 18 oriented toward the lower wall 8, the rear edge 23 being furthest from the face 6.

The engagement of the gate 14 with the spring 16, held by the gate, then consists of pushing it into the body 2 along the lower wall 8, as illustrated schematically in FIGS. 7 and 8, i.e., from the back face 6 toward the front opening 4.

Figure 4:
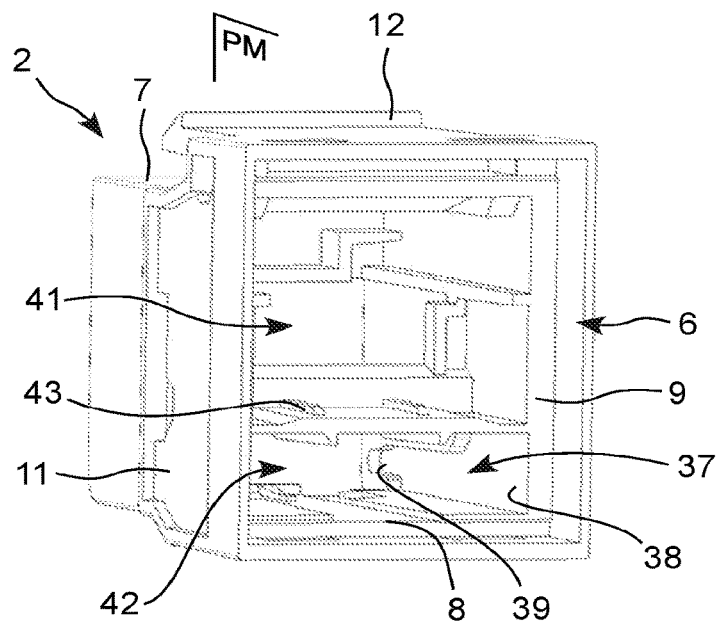
FIG. 4 is a rear view of the connector body according to the invention.

As visible in FIGS. 1 and 4, the first side wall 9 includes, on its inner face, a first groove 37 extending along the bottom wall 8. This groove 37, which guides the first lug 27 during the insertion of the gate 14, comprises an open back end 38, located near the back face 6, to allow the engagement of said gate 14, but it comprises a front end 39, located near the front opening 4, that is closed to make it impossible to remove the gate 14 through the front opening 4.

Similarly, the second side wall 11 comprises a second slot or groove, not identified because it does not appear in the figures, that is symmetrical to the groove 37 relative to a median plane of the body 2. Said median plane, which is identified by PM in FIGS. 1 to 4, is equidistant from the side walls 9 and 11 and constitutes a general plane of symmetry of the body 2 of the connector according to the invention.

Concretely, when the gate 14 slides along the lower wall 8 to be installed in the body 2, its side lugs 27 and 28 are respectively guided in the first groove 37 of the first side wall 9, and in the corresponding second groove formed in the second side wall 11, which makes it possible to keep the gate at a small distance from the lower wall 8 during its insertion.

During this phase, the arch 34 of the spring 16 bears against the upper face of the lower wall 8, such that said spring tends to continuously separate the gate 14 from the wall 8 by pivoting it around the lugs 27 and 28, i.e., around its front edge 22. A sustained pressure applied by the assembly operator on the back edge 23 during the beginning of the sliding of the gate into the body 2 is sufficient to oppose the opening force exerted by the spring 16 during the engagement.

Additionally, and as shown in FIG. 7, the inner space of the body 2 is separated into an upper part 41 and a lower corridor 42 by a platform 43, or wall, which extends parallel to the upper wall 7 and the lower wall 8. The upper part 41 is intended to contain a set of connecting plugs, not shown, that are intended to receive corresponding plugs of the element 13. The lower corridor 42 is intended to allow the passage of the gate 14 with its spring 16 during its assembly.

In practice, once the gate 14 is engaged in the lower corridor 42, like in the example of FIGS. 7 and 8, it is no longer necessary to press its lower edge 23 toward the lower wall 8, the gate 14 being captured in the lower corridor, with the spring 16 tending to press the outer face 17 of said gate 14 toward the platform 43.

Figure 9:
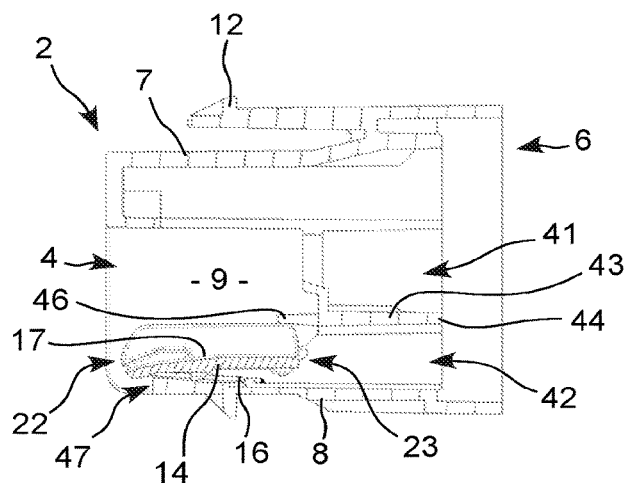
FIG. 9 is a lateral sectional view of the connector body according to the invention at the end of engagement of its gate.
Figure 10:
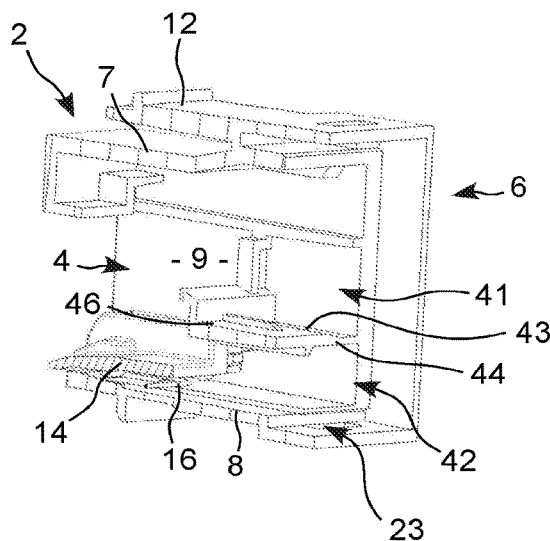
FIG. 10 is a perspective sectional view of the connector body according to the invention at the end of engagement of its gate.

At this stage, it is therefore sufficient to push the lower edge 23 of the gate 14 toward the front opening 4 in order to continue the assembly, as shown schematically in FIGS. 9 and 10.

The platform 43 is delimited by a parallel back border 44 and front border 46 oriented normal to the plane PM. The back border 44 is located in the immediate vicinity of the back face 6, while the front border 46 of the platform is located substantially at mid-length of the body 2, i.e., at mid-distance between the opening 4 and the back face 6.

When the back edge 23 of the gate 14 has passed the front border 46 of the platform 43, it becomes free to move away from the back wall 8. At the same time, the two side lugs 27 and 28 have then reached the front end 39 of the first groove, and the corresponding end of the second groove, not visible, which prevents the gate 14 from advancing further toward the opening 4.

Figure 11:
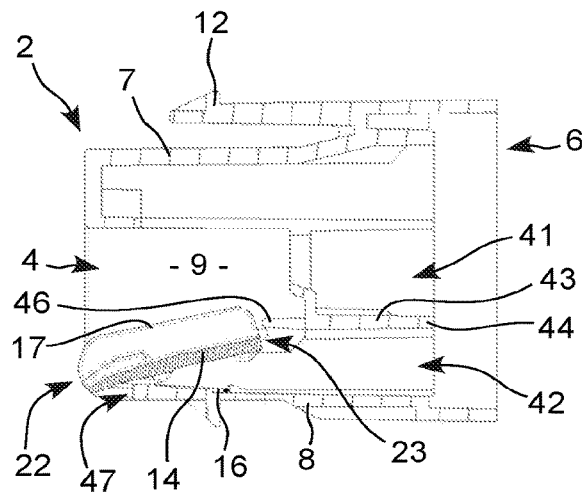
FIG. 11 is a lateral sectional view of the connector body according to the invention at the beginning of raising of its gate.
Figure 12:
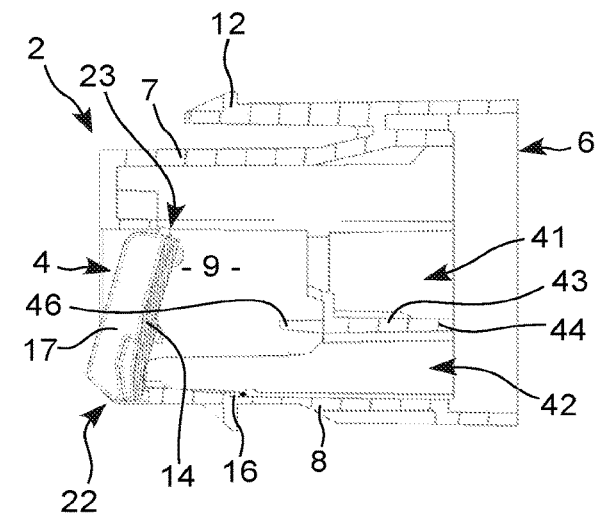
FIG. 12 is a lateral sectional view of the connector body according to the invention at the end of raising of its gate.
Figure 13:
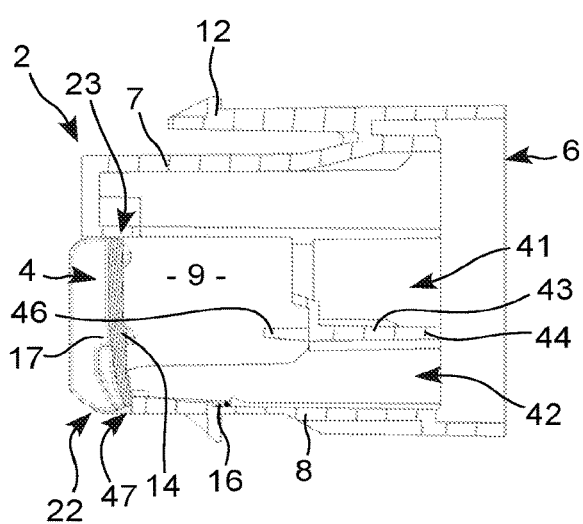
FIG. 13 is a lateral sectional view of the connector body according to the invention when its gate is fully raised.

At this stage, the gate 14 deploys by rotating around its front edge 22, its back edge 23 then coming closer to an upper edge of the opening 4, as illustrated schematically in FIGS. 11 to 13.

Figure 14:
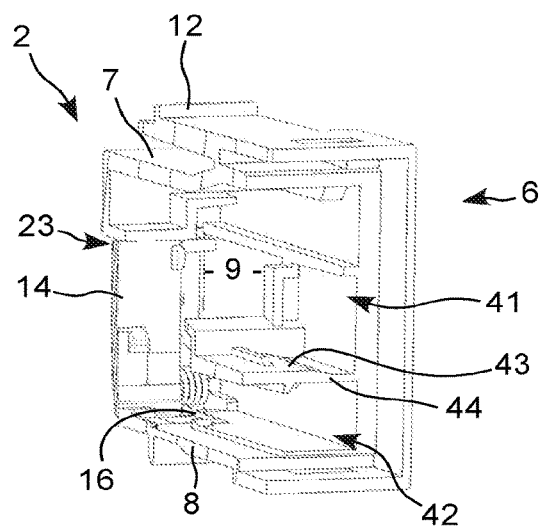
FIG. 14 is a perspective sectional view of the connector body according to the invention when its gate is fully raised.

In the situation of FIGS. 13 and 14, the gate 14 is completely deployed, i.e., it fully closes off the opening 4 in order to close it to prevent dust and other grime from entering. In this situation, the front edge 22 of the gate 14 bears against a rim 47 forming the front end of the lower wall 8, so as to be kept in the closing position. Additionally, its back edge 23 bears against a corresponding rim of the opening 4, to make sure that it cannot be removed through the opening 4. In general, the opening 4 has dimensions substantially smaller than those of the gate 14, to make sure that said gate remains caught in the connector body 2 under all circumstances.

When a male connecting element like the element 13 must be connected to the connector 1, it is first presented across from the opening 4 closed by the gate 14. Then, the operator exerts pressure on the element 13 in order to press on the gate 14, against the spring return force. This pressure results in tilting the gate, coming closer to its back edge 23 of the lower wall 8, along a movement that corresponds to that of FIGS. 13 to 11.

Once the gate 14 is completely folded down against the lower wall 8, like in FIG. 10, the element 13 engages in the opening 4, until it faces the upper part 41 to have its plugs engaged in the corresponding plugs of the connector 1.

In a complementary manner, and as shown in FIG. 6, the gate 14 comprises two hooks 49, 51 that protrude from its inner face 18, and that become locked in corresponding recesses formed in the lower wall 8, when this gate 14 is open, i.e., folded down against said wall.

Concretely, said hooks 49, 51 make it possible to prevent any movement of the gate 14 toward the back face 6, when it is folded down against the lower face 8 and the engagement movement of the element 13 tends to push it in toward the back.

In general, the connector according to the invention is easy to assemble, it guarantees that the gate cannot be lost, and it effectively closes off the insertion opening when the latter does not receive any male connector. Lastly, in the connector according to the invention, the closing gate is completely transparent for the operator: it closes off the opening when there is no element 13, and it spontaneously folds down if such a connecting element is inserted.

The invention claimed is:

1. A female connector, comprising:
   a body having a front wall comprising a front opening for the insertion of a male connector, a back face opposite the front wall, a base wall extending from the back face to the front opening, and an upper wall jointly defining with the base wall an inner space of the body;
   a gate configured to close the front opening that is movable between an open position in which the gate is folded down against the base wall and a closed position in which the gate closes off the front opening by covering the front opening;
   a return spring held by the gate and tending to bring the gate back toward the closed position; and
   an intermediate wall extending from the back face between the base wall and the upper wall such that the intermediate wall and the base wall jointly define a corridor in the inner space, said corridor being arranged to;
      allow the gate to be mounted in the body by moving said gate equipped with the return spring through the corridor via the back face up to the front opening, and
      restrain movement of the return spring relative to the gate during said moving of said gate equipped with the return spring through the corridor, the return spring being held against the base wall and the gate being held against the intermediate wall.

2. The connector according to claim 1, wherein the intermediate wall extends parallel to the base wall.

3. The connector according to claim 1, wherein the base wall comprises, near the front opening, a rim on which a corresponding edge of the gate bears when the gate is in the closed position.

4. The connector according to claim 1,
   wherein the gate comprises two side lugs, and
   wherein the body comprises, aligned with inner faces of the corridor, two guide grooves being configured to guide said lugs during the moving of the gate through the corridor.

5. The connector according to 4, wherein the return spring comprises two windings each engaged around a corresponding lug of the gate, each winding being extended by an arm bearing in a corresponding housing the gate, the two windings being joined by an arch bearing on the base wall.

* * * * *